United States Patent
Zhang

(10) Patent No.: US 10,327,346 B2
(45) Date of Patent: Jun. 18, 2019

(54) DEFORMABLE SURFACE APPARATUS, ELECTRONIC DEVICE, AND METHOD

(71) Applicant: Lenovo (Beijing) Limited, Beijing (CN)

(72) Inventor: Ran Zhang, Beijing (CN)

(73) Assignee: Lenovo (Beijing) Limited, Beijing (CN)

( * ) Notice: Subject to any disclaimer, the term of this patent is extended or adjusted under 35 U.S.C. 154(b) by 0 days.

(21) Appl. No.: 15/476,756

(22) Filed: Mar. 31, 2017

(65) Prior Publication Data

US 2017/0290179 A1 Oct. 5, 2017

(30) Foreign Application Priority Data

Mar. 31, 2016 (CN) .......................... 2016 1 0202617

(51) Int. Cl.
*G06F 1/16* (2006.01)
*H05K 5/00* (2006.01)
*H05K 7/00* (2006.01)
*H05K 5/02* (2006.01)
*G02F 1/1333* (2006.01)

(52) U.S. Cl.
CPC ......... *H05K 5/0226* (2013.01); *G06F 1/1652* (2013.01); *G06F 1/1681* (2013.01); *H05K 5/0017* (2013.01); *H05K 5/0217* (2013.01); *G02F 1/133305* (2013.01)

(58) Field of Classification Search
CPC .. H05K 5/0226; H05K 5/0017; H05K 5/0217; G06F 1/1681; G06F 1/1652
USPC .............. 361/679.26–679.3, 679.55, 679.56; 455/575.1–575.9
See application file for complete search history.

(56) References Cited

U.S. PATENT DOCUMENTS

| | | | | | |
|---|---|---|---|---|---|
| 9,348,370 | B2 * | 5/2016 | Song | ...................... | G06F 1/1681 |
| 9,348,450 | B1 * | 5/2016 | Kim | ...................... | G06F 1/1681 |
| 9,848,502 | B1 * | 12/2017 | Chu | ........................ | F16C 11/04 |
| 9,874,906 | B1 * | 1/2018 | Hsu | ........................ | G06F 1/1681 |
| 2014/0123436 | A1 * | 5/2014 | Griffin | ................ | H04M 1/0216 16/221 |
| 2015/0077917 | A1 * | 3/2015 | Song | ...................... | G06F 1/1652 361/679.27 |

FOREIGN PATENT DOCUMENTS

| | | |
|---|---|---|
| CN | 105278627 A | 1/2016 |
| CN | 205117973 U | 3/2016 |
| CN | 205121424 U | 3/2016 |

* cited by examiner

*Primary Examiner* — Anthony M Haughton
(74) *Attorney, Agent, or Firm* — Kunzler Bean & Adamson

(57) ABSTRACT

An apparatus is disclosed. The apparatus may include at least two rotation shafts arranged substantially parallel to one another. The apparatus may include at least two fixing members. At least one fixing member of the at least two fixing members may be disposed at each side of the at least two rotating shafts. The apparatus may include at least two sliding members. A least one sliding member of the at least two sliding members may connect at least one rotating shaft to at least one fixing member. Each of the at least two sliding members may be disposed on opposite sides of the at least two rotating shafts. In response to the at least two rotation shafts rotating, a distance between the two or more rotating shafts and the at least two fixing members changes in a lengthwise direction. An electronic device and method are disclosed.

20 Claims, 3 Drawing Sheets

DEFORMABLE SURFACE APPARATUS, ELECTRONIC DEVICE, AND METHOD

FIELD

The present disclosure relates to electronic devices, and in particular to a deformable surface apparatus, electronic device, and method.

BACKGROUND

Some devices include flexible screens, displays, surfaces, or the like. However, due to the flexing, some of these may stretch or compress a surface on the flexible screen, display, surface, or the like. This stretching or compressing may damage the flexible surface or the components within or related to the screen.

SUMMARY

In one embodiment, an apparatus is disclosed. The apparatus may include a deformable surface apparatus. The apparatus may include at least two rotation shafts. The rotation shafts may be arranged substantially parallel to one another. The apparatus may include at least two fixing members. At least one fixing member of the at least two fixing members may be disposed at each side of the at least two rotating shafts. The apparatus may include at least two sliding members. A least one sliding member of the at least two sliding members may connect at least one rotating shaft to at least one fixing member. Each of the at least two sliding members may be disposed on opposite sides of the at least two rotating shafts. In one embodiment, in response to the at least two rotation shafts rotating, a distance between the two or more rotating shafts and the at least two fixing members changes in a lengthwise direction.

In one embodiment, an electronic device is disclosed. The electronic device may include a deformable surface apparatus. The deformable surface apparatus may include at least two rotation shafts. The rotation shafts may be arranged substantially parallel to one another. The deformable surface apparatus may include at least two fixing members. At least one fixing member of the at least two fixing members may be disposed at each side of the at least two rotating shafts. The deformable surface apparatus may include at least two sliding members. A least one sliding member of the at least two sliding members may connect at least one rotating shaft to at least one fixing member. Each of the at least two sliding members may be disposed on opposite sides of the at least two rotating shafts. In one embodiment, in response to the at least two rotation shafts rotating, a distance between the two or more rotating shafts and the at least two fixing members changes in a lengthwise direction. In one embodiment, the electronic device may include a flexible screen. The flexible screen may be disposed on a surface of the at least two rotation shafts.

In one embodiment, a method is disclosed. The method may include providing at least two rotation shafts. The method may include providing at least two fixing members. At least one fixing member may be disposed at each side of the at least two rotating shafts. The method may include providing at least two sliding members connecting the at least two rotating shafts and the fixing members. Each of the at least two sliding member may be disposed on opposite sides of the at least two rotating shafts. The method may include rotating the at least two rotation shafts. The method may include, in response to the rotating the at least two rotation shafts, moving the at least two sliding members in relation to the at least two fixing members. The method may include adjusting a length of the at least two rotation shafts, at least two fixing members, and at least two sliding members.

BRIEF DESCRIPTION OF THE DRAWINGS

In order to illustrate embodiments of the present disclosure, a brief description of the drawings is provided. It should be apparent to those skilled in the art that the drawings of the embodiments in the following description are only to illustrate some embodiments of the present disclosure.

DETAILED DESCRIPTION

The present disclosure provides embodiments of a deformable surface apparatus. The deformable surface apparatus may include a flexible screen. The deformable surface apparatus may prevent damage to the flexible screen. In one embodiment, the deformable surface apparatus may prevent damage by applying a compression force or a stretching force on the flexible screen. The compression or stretching force may counteract a compression or stretching of the flexible screen in response to flexing, deformation, or the like of the flexible screen.

The embodiments of the present disclosure are described as follows with reference to the accompanying drawings. The embodiments described are not all, but rather only some of the embodiments of the present disclosure. Based on the embodiments, all other embodiments derived by persons of ordinary skill in the art fall within the protection scope of the present disclosure.

Figure 1:
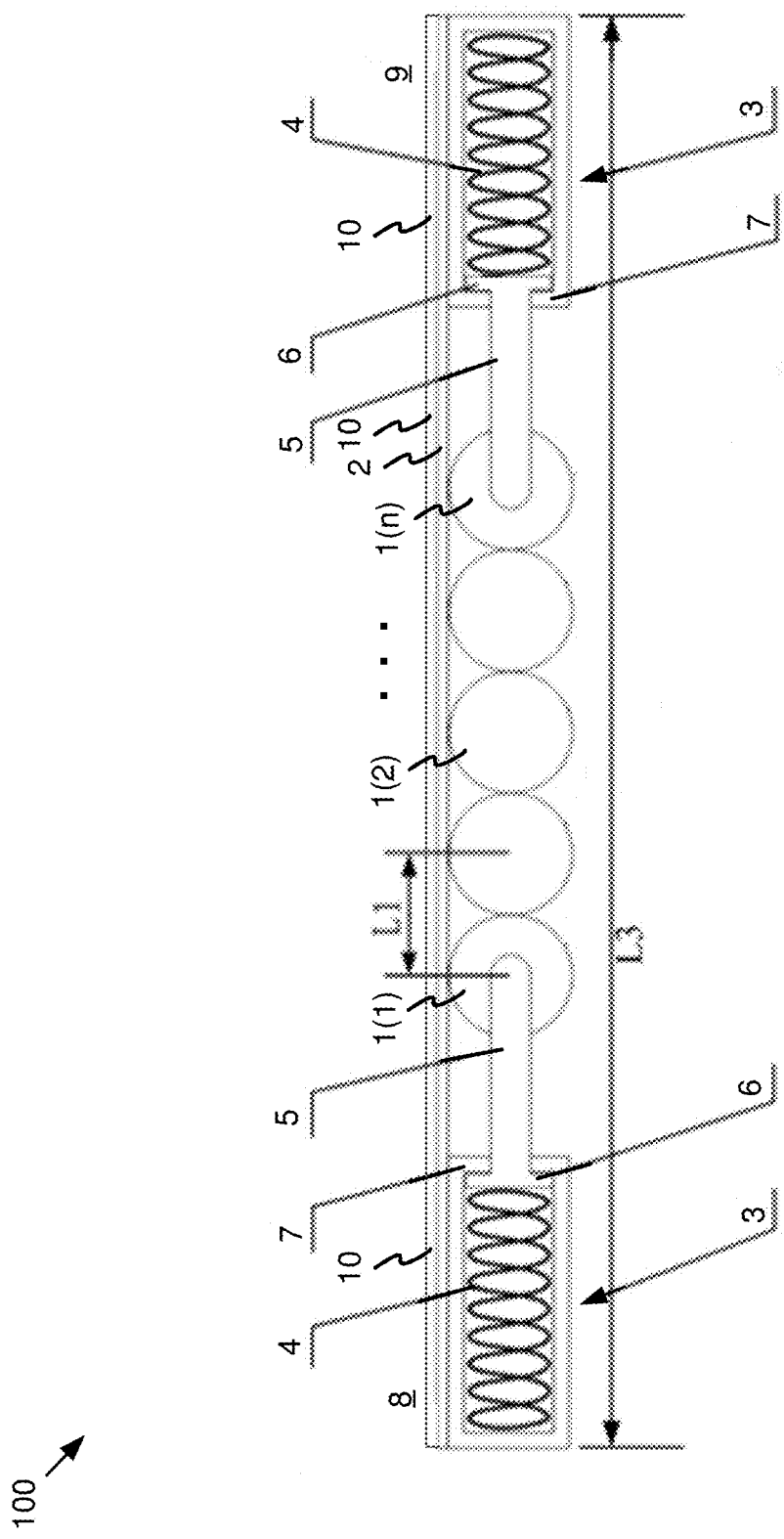
FIG. 1 is a structural schematic view illustrating one embodiment of a rotating shaft mechanism.

FIG. 1 depicts one embodiment of a deformable surface apparatus 100. In one embodiment, the deformable surface apparatus 100 may include one or more rotating shafts 1(1)-(n). In one embodiment, the deformable surface apparatus 100 may include a cover plate 2. The deformable surface apparatus 100 may include a sliding member 5. The deformable surface apparatus 100 may include a fixing member 3. In some embodiments, the fixing member 3 may be disposed on the sliding member 5.

In one embodiment, the deformable surface apparatus 100 may include one or more rotating shafts 1. As seen in FIG. 1, each of the one or more rotating shafts 1 may be referred to individually as rotating shaft 1(1), rotating shaft 1(2), . . . , rotating shaft 1(n). As referred to herein, the collection of one or more rotating shafts 1(a)-(n) are referred to as the one or more rotating shafts 1. If individual rotating shafts are referred to, they will be referred to as the rotating shaft 1(1), rotating shaft 1(2), . . . , and/or rotating shaft 1(n) as needed.

In one embodiment, the one or more rotating shafts 1 may include at least two rotation shafts 1. The at least two rotation shafts 1 may be disposed substantially in parallel. In one embodiment, the at least two rotation shafts 1 may be disposed in parallel in response to the deformable surface apparatus 100 being in an open state, undeformed state, or the like. The distance between a first rotation shaft 1(1) and a second rotation shaft 1(2) may include the distance L1. The distance L1 may include the distance between the center of the first rotation shaft 1(1) and the second rotation shaft 1(2).

In one embodiment, the deformable surface apparatus 100 may include one or more fixing members 3. A fixing member 3 may include a structure that adjusts the distance between the fixing member and the one or more rotation shafts 1. The fixing member 3 may produce a reciprocal motion between the fixing member 3 and the one or more rotation shafts 1. For example, as explained further below, the fixing member 3 may include an elastic member 4 (such as a spring) that may engage with a sliding member 5.

At least one fixing member 3 may be disposed on the first side 8 of the one or more rotating shafts 1 and at least one fixing member 3 may be disposed on the second side 9 of the one or more rotating shafts 1, as depicted in FIG. 1. The first side 8 and the second side 9 may be disposed on opposite sides of the deformable surface apparatus 100. In one embodiment, the first side 8 and the second side 9 may be disposed in opposite directions extending tangentially on a straight line, as shown in FIG. 1.

Figure 2:
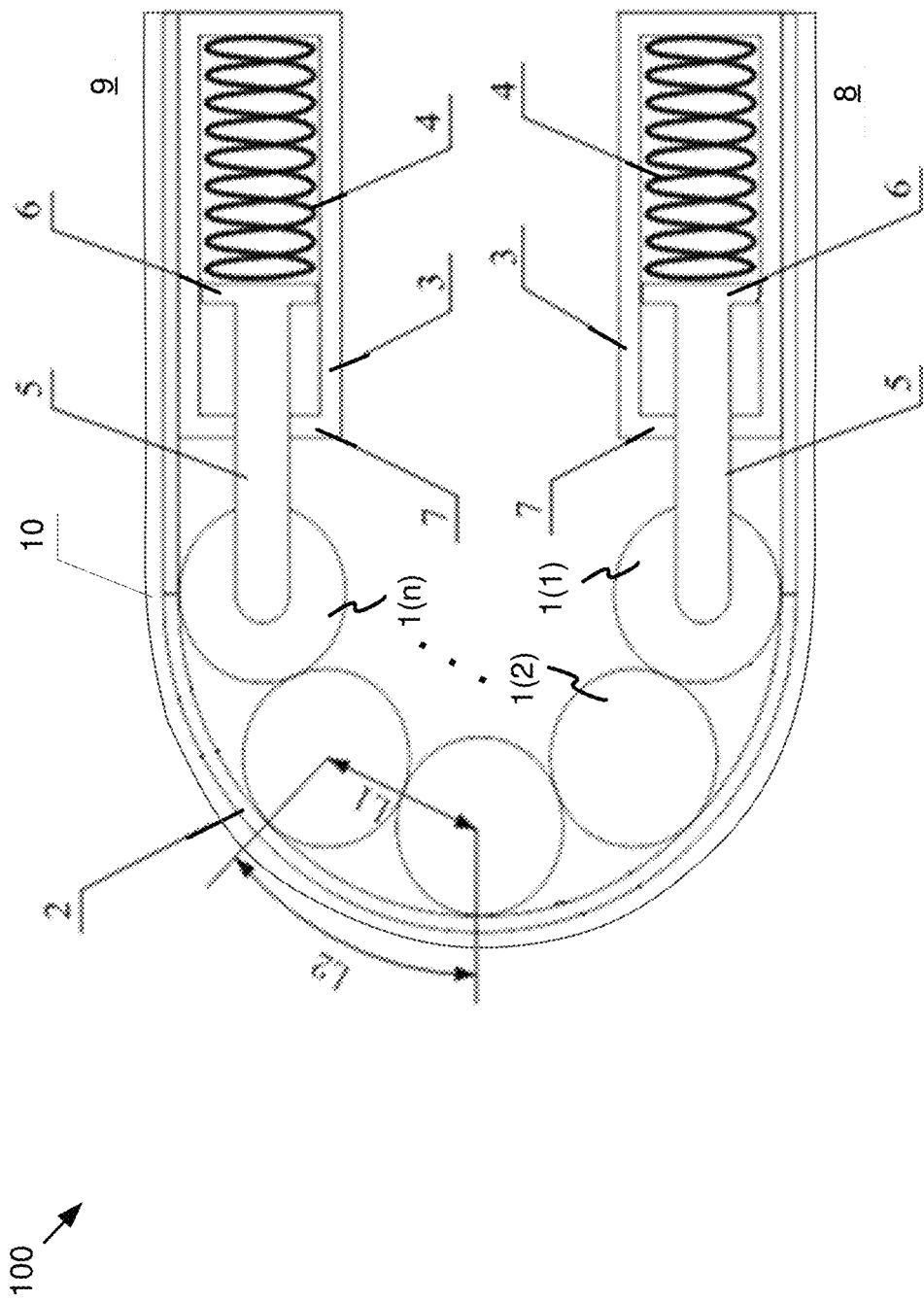
FIG. 2 is a structural schematic view illustrating another embodiment of a rotating shaft mechanism.

In some embodiments, the deformable surface apparatus may include a sliding member 5. The sliding member 5 may connect the rotating shaft 1 and the fixing member 3. In response to one or more rotating shafts 1 moving towards or away from each other, the sliding member 5 may change position. As used herein, one or more rotating shafts 1 moving towards or away from each other may include the first side 8 and the second side 9 moving towards or away from each other. One or more rotating shafts 1 moving towards each other may include the deformable surface apparatus 100 deforming into an arc shape as shown in FIG. 2. One or more rotating shafts 1 moving away from each other may include the deformable surface apparatus 100 deforming into a substantially planar shape, as depicted in FIG. 1.

In some embodiments, the one or more rotating shafts 1 may include only one rotating shaft 1, and thus, the rotating shaft 1 may not move toward or away from itself. However, for convenience of the description herein, the one or more rotating shafts 1 moving towards or away from each other may include at least that the first side 8 and the second side 9 move towards or away from each other. The distance between the one or more rotating shafts 1 and the fixing member 3 may change in a lengthwise direction of the deformable surface apparatus 100. The sliding member 5 may be disposed on at least one of the sides of the one or more rotating shafts 1 disposed towards the first side 8 or second side 9.

In some embodiments, the deformable surface apparatus 100 may be in a spread-out, open, undeformed, or the like state (herein referred to as a "spread-out" state). The spread-out state may include a state where the cover plate 2 is substantially planar, as depicted in FIG. 1. In one embodiment where the one or more rotation shafts 1 include two or more rotation shafts 1, the spread-out state may include a state where the two or more rotation shafts are disposed parallel to each other or are disposed in a substantially planar arrangement, as depicted in FIG. 1.

The deformable surface apparatus 100 may be disposed on an electronic device. One or more portions of the electronic device may be opened and closed. The electronic device may include a flexible screen 10. The flexible screen 10 may be disposed on the one or more rotating shafts 1 and the fixing member 3.

FIG. 2 depicts one embodiment of the deformable surface apparatus 100 in a closed state. In response to the deformable surface apparatus 100 moving the flexible screen 10 to change from a spread-out state to a closed state, the one or more rotating shafts 1 may bend in response to the one or more rotation shafts 1 moving towards or away from each other. In one embodiment, the flexible screen 10 may change state (e.g. from spread-out to closed or vice versa) in response to the one or more rotation shafts 1 rotating. A length L2 may include a length of an arc corresponding to a diameter length of a rotating shaft 1. As depicted in FIG. 2, the length L2 may be greater than the length L1. The length L2 may include an arc tangential to all of the one or more rotation shafts 1 may be greater than a length of a straight line tangential to all of the one or more rotation shafts 1 in response to axes of all of the one or more rotation shafts 1 being located in the same plane as depicted in FIG. 1.

For example, the length of the tangential arc is L2*(n−1), the length of the tangential straight line is L1*(n−1) where n is the number of rotation shafts of the one or more rotation shafts 1. Since L2>L1, L2*(n−1)>L1*(n−1). In other words, in response to the one or more rotation shafts 1 moving towards or away from each other, a distribution length of multiple rotation shafts 1 may increase. A length L3 of a line formed by the tangential straight line extending to end portions of the fixing member 3 on the outermost side of two ends may remain unchanged. The length L3 may include a sum of the lengths of the one or more rotating shafts 1, the sliding member 5 and the fixing member 3.

In one embodiment, in response to the one or more rotation shafts 1 moving towards or away from each other, the one or more rotation shafts 1 may move in relation to the fixing member 3. For example, the movement distance may experience displacement compensation through the movement of the sliding member 5. The movement of the sliding member 5 may offset a change in the length of a surface of the one or more rotating shafts 1 caused by a change in a position of the rotating shaft 1 in response to deforming the deformable surface apparatus 100. For example, the surface of the one or more rotating shafts 1 may include an outside surface (i.e. the side that may move away from each other in response to the one or more rotation shafts 1 changing position, as shown in FIG. 2). In response to the displacement of the sliding member 5, the length of the outside surface of the deformable surface apparatus 100 may remain unchanged. Thus, the length of the flexible screen 10 disposed on the on the deformable surface apparatus 100, since the outside length remains unchanged in response to deformation, the flexible screen 10 may not be stretched or compressed, preventing damage to the flexible screen 10. In some embodiments, the flexible screen 10 may be disposed on the inside surface of the deformable surface apparatus 100 (i.e. the side that moves towards each other in response to the one or more rotation shafts 1 changing position).

In one embodiment, a sliding member 5 may be connected to a rotating shaft 1(1) or 1(n) located on the outermost side in the one or more rotating shafts 1, as shown in FIG. 1 and FIG. 2. In some embodiments, the one or more rotating shafts 1 may, in part, carry out the opening and closing of one or more portions of the electronic device. For example, the one or more rotating shafts 1 may assist in the opening and closing of the keyboard portion and the screen portion by one or more rotation shafts 1 moving towards or away from each other. By connecting the sliding member 5 with the outermost rotating shaft 1(1) or 1(n), the rotation performance of the one or more rotating shafts 1 can be exploited. By keeping a rotation radius of a sufficient length, a relative rotation between the keyboard portion and the screen portion may be more flexible and smooth.

In one embodiment, a first end of the sliding member 5 may be connected to the rotating shaft 1. A second end of the sliding member may be slidably connected to the fixing member 3. In response to the one or more rotation shafts 1 moving towards or away from each other, the sliding member 5 may move in relation to the fixing member 3 under the driving of the one or more rotating shafts 1. As discussed above, a relative distance between the planarly arranged one or more rotation shafts 1 may change in response to deformation, and a tangent length corresponding to the one or more rotating shafts 1 may increase. Thus, to assist in the length of the one or more rotating shafts 1 remaining unchanged, an increased length is required to be compensated for, such that corresponding lengths of other components, except for the one or more rotating shafts 1, in a direction of the tangential straight line are decreased. One way this compensation may occur may include enabling the sliding member 5 to slide in relation to the fixing member 3, so that both the sliding member 5 and the fixing member 3 partially overlap.

In one embodiment, the deformable surface apparatus 100 may include an elastic member 4. In one embodiment, the elastic member 4 may include a spring. In some embodiments, the elastic member may include an elastic sheet, a torsion spring, another component that may be deformed and store energy, or the like. In one embodiment, the elastic member 4 may be disposed inside the fixing member 3.

One end of the elastic member 4 may connect to the sliding member 5 and the other end may connect to the fixing member 3. In response, the sliding member 5 may be subjected to a compression force or a stretching force in the process of sliding. The one or more rotating shafts 1 may be disposed with the flexible screen 10 or cover plate 2. The deformation discussed above, and in some embodiments, in conjunction with the elastic member 4, may prevent the flexible screen 10 or the cover plate 2 from producing wrinkles and may enable the flexible screen 10 or the cover plate 2 to exhibit a plane state or a rounded arc surface state.

In some embodiments, the arrangement of the elastic member 4 may enable a more stable movement of the sliding member 5 in response to sliding, and may prevent the sliding member 5 from effecting a tactile sensation of operation due to changing in displacement too rapidly and excessively. In one embodiment, the elasticity of the elastic member 4 may be applied to the one or more rotating shafts 1 through the sliding member 5. In response, the elastic member 4 may provide a torsion for keeping the rotating shaft set at a certain angle.

In one embodiment, the deformable surface apparatus 100 may include a catching member 6. The catching member 6 may include a stop, lip, protrusion, or the like. The catching member 6 may be disposed on the sliding member 5. The catching member 6 may be disposed on the side of the sliding member facing the elastic member 4. The deformable surface apparatus 100 may include a positioning member 7. The positioning member may include a surface, a surface with an aperture (to allow the sliding member to protrude into the fixing member), or the like. The positioning member 7 may be disposed on the fixing member 3 and may face toward the sliding member 5. The positioning member 7 may be capable of engaging with the catching member 6 to limit a movement trajectory of the sliding member 5.

In one embodiment, to prevent the deformable surface apparatus 100 from experiencing an overlarge displacement amount of the sliding member 5, the catching member 6 may be capable of moving along with the sliding member 5 and may be arranged on the sliding member 5. The positioning member 7 may be disposed on the fixing member 3. The positioning member 7 may cooperate with the catching member 6 and may be capable of limiting the movement trajectory of the sliding member 5. The positioning member 7 may limit a movement direction and distance of the sliding member 5 and may preventing damage to the sliding member 5 due to an excess movement or a deflection movement of the sliding member 5. In some embodiments, the catching member 6 may be disposed on an end portion of the sliding member 5 connecting to the elastic member 4. The catching member may include a tab that projects out of a sidewall of the sliding member 5, as shown in FIG. 1 and FIG. 2. The positioning member 7 may include a baffle plate arranged perpendicularly to the sliding member 5. The baffle plate may include a through-hole that may allow the sliding member 5 to pass through and may block the positioning member 7. In one embodiment, the baffle plate and the fixing member 3 may be integrally structured or the baffle plate may be part of the fixing member 3.

The deformable surface apparatus 100 may include a cover plate 2. The cover plate 2 may cover the one or more rotating shafts 1. The cover plate 2 may be capable of bending with the one or more rotating shafts 1. In response to the axes of all of the one or more rotation shafts 1 being disposed in the same plane, the cover plate 2 may spread into a plane. In response to the one or more rotation shafts 1 moving towards or away from each other, the cover plate 2 may bend into a rounded arc-shaped face, as shown in FIG. 2.

In one embodiment, the one or more rotating shafts 1 may be exposed on an outer surface of the electronic product. A configuration of the one or more rotating shafts 1 may include multiple connected arc-shaped faces. In some embodiments, the arc-shaped face may refer to a part of an outer circumferential face of respective one or more rotation shafts 1. In some embodiments, a strip plate including a width substantially equal to a diameter of a rotating shaft 1(1) and a length substantially equal to a length of the rotating shaft 1(1) (not shown in the figure) may be disposed on each rotational outer side such that the strip plate may cover the rotating shaft 1.

In some embodiments, such an arrangement may enable the multiple strip plates to connect into a plane such that there may be no gap between the keyboard part and the screen part when the one or more rotating shafts 1 are in a state as shown in FIG. 1. In response to the one or more rotation shafts 1 moving towards or away from each other (i.e. when the one or more rotating shafts 1 are in a state as shown in FIG. 2), the strip plates may not be connected into a smooth arc-shaped face. In some embodiments, a distribution length of the one or more rotation shafts 1 may increase and a larger gap may exist between adjacent strip plates. In some embodiments, to prevent such gaps, a complete cover plate 2 may cover the one or more rotating shafts 1, the sliding member 5, and the fixing member 3.

In one embodiment, the cover plate 2 may connect to the fixing member 3. The one or more rotating shafts 1 may be capable of moving on a surface of the cover plate 2. The length of the cover plate 2 along a lengthwise direction of the deformable surface apparatus 100 may remain unchanged, as shown in FIG. 1 and FIG. 2. In one embodiment, the cover plate 2 may include a complete metal plate that may be bendable with an entire covering area remaining unchanged. The metal may include steel or the like. In one embodiment, the cover plate 2 and the deformable surface apparatus may be connected. For example, the cover plate 2 may connect to the fixing members 3 at two ends and may make contact with each rotating shaft $1(1)$-$(n)$, as shown in FIG. 1 and FIG. 2. In response, a covering length of the cover plate 2 may include a sum of the radial lengths of the fixing member 3, the sliding member 5, and the one or more rotating shafts 1, as shown in FIG. 1. The elastic member 4 may be in a natural (i.e. uncompressed) length in this state.

In response to n rotation shafts $1(1)$-$(n)$ being in the state as shown in FIG. 1, a length of the cover plate 2 corresponding thereto may include n*L1. In response to the one or more rotating shafts 1 changing to the state as shown in FIG. 2, the length of the cover plate 2 corresponding to the one or more rotation shafts may include (n−1)*L2+L1. In some embodiments, that length may increase from the length shown in FIG. 1. In the case of the covering length of the cover plate 2 being unchanged, the sliding member 5 may move to at least partially overlap the fixing member 3. In response, the lengths of the sliding member 5 or the fixing member 3. The one or more rotating shafts 1 may move in relation to the cover plate 2. In some embodiments, the cover plate 2 may also be connected on other components of the electronic device. In one embodiment, the flexible screen 10 may be directly disposed on the fixing members 3 and the one or more rotating shafts 1.

In one embodiment, the fixing member 3 may include a housing for accommodating the elastic member 4. The structure of the fixing member 3 may include a variety of forms. In some embodiments, the fixing member 3 may include a rectangular housing-shaped structure. The fixing member 3 may wrap around the elastic member 4. The fixing member 3 may position the one or more rotating shafts 1 and may protect the elastic member 4.

In one embodiment, the sliding member 5 may include two sliding members 5 disposed on both sides of the one or more rotating shafts 1 and may be respectively connected to the two outermost rotation shafts $1(1)$ and $1(n)$, as shown in FIG. 1 and FIG. 2. In one embodiment, the sliding members 5 may be disposed on both sides of the one or more rotating shafts 1 such that, in response to the one or more rotating shafts 1 rotating in response to deformation, an acting force produced at the two ends may transfer to the two ends of the fixing member 3. In response, the cover plate 2 may not be subjected to a squeezing force, and the flexible screen 10 may not stretch or compress.

Figure 3:
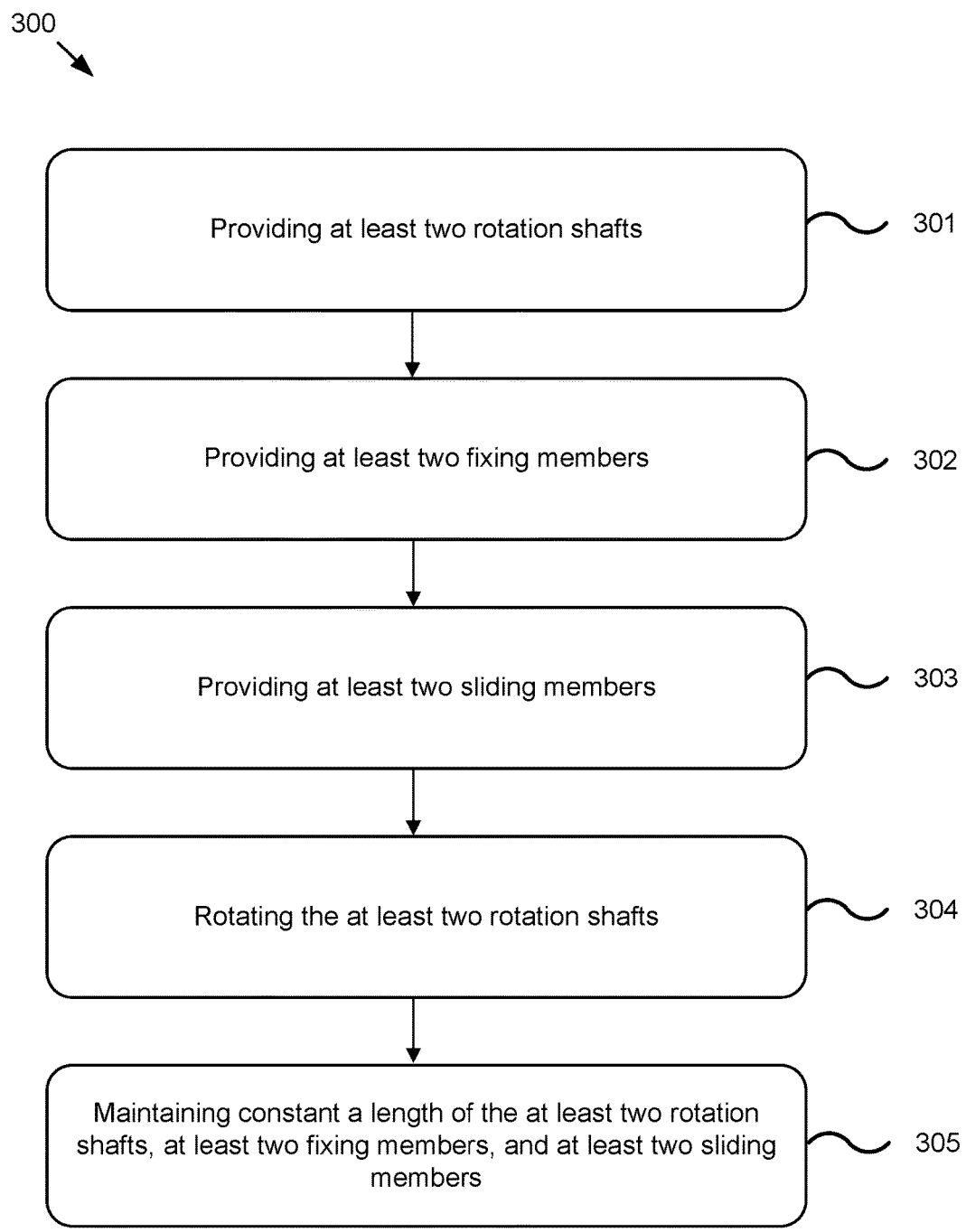
FIG. 3 is a schematic flow diagram depicting one embodiment of a method.

FIG. 3 depicts one embodiment of a method 300. In one embodiment, the method 300 may include providing 301 at least two rotation shafts. The at least two rotation shafts may include the rotation shafts 1 as described above. In one embodiment, the method 300 may include providing 302 at least two fixing members. The at least two fixing members may include a fixing member 3 as described above. At least one fixing member may be disposed at each side of the at least two rotating shafts. In one embodiment, the method 300 may include providing 303 at least two sliding members. The at least two sliding members may include a sliding member 5 as described above. A least one sliding member may connect at least one rotating shaft to at least one fixing member. Each of the at least two sliding members may be disposed on opposite sides of the at least two rotating shafts.

In one embodiment, the method 300 may include rotating 304 the at least two rotation shafts. Rotating the at least two rotation shafts may include the at least two rotation shafts moving towards or away from each other as described above. In one embodiment, the method 300 may include maintaining 305 constant a length of the at least two rotation shafts, at least two fixing members, and at least two sliding members. For example, as described above, in response to the displacement of the sliding member 5, the length of the outside surface or inside surface of the deformable surface apparatus 100 may remain unchanged. Thus, the length of a flexible screen 10 disposed on the on the deformable surface apparatus 100, since the outside length remains unchanged in response to deformation, may not be stretched or compressed, preventing damage to the flexible screen 10.

In one embodiment, the rotating 304 the at least two rotation shafts may include rotating the at least two rotation shafts into an arc shape. For example, as described above, the first side 8 and the second side 9 may move towards each other in response to the rotation of the one or more rotation shafts 1 and may form an arc shape as depicted in FIG. 2.

In one embodiment, the rotating 304 the at least two rotation shafts may include the two sliding members moving into the at least two fixing members. For example, as described above, a sliding member 5 may move into a fixing member 3 as depicted in FIG. 2. In one embodiment, the maintaining 305 constant the length of the at least two rotation shafts, at least two fixing members, and at least two sliding members may include moving the at least two sliding members into the at least two fixing members a length substantially equal to an increase in length of the at least two rotation shafts from a tangential straight line to a tangential arc, as described above.

In one embodiment, the rotating 304 the at least two rotation shafts may include rotating the at least two rotation shafts into a substantially flat plane. For example, as described above, in one embodiment, the first side 8 and the second side 9 may move away from each other in response to the one or more rotation shafts 1 rotating as depicted in FIG. 1.

In one embodiment, rotating 304 the at least two rotation shafts may include the two sliding members moving away from the at least two fixing members. For example, as described above, a sliding member 5 may move away a fixing member 3 as depicted in FIG. 1. The catching member 6 of the sliding member 5 may engage with the positioning member of the fixing member 3. In one embodiment, the maintaining 305 constant the length of the at least two rotation shafts, at least two fixing members, and at least two sliding members may include moving the at least two sliding members away from the at least two fixing members a length substantially equal to a decrease in length of the at least two rotation shafts from a tangential arc to a tangential straight line, as described above.

In the description herein, the terms "includes," "including," or another variation thereof are intended to cover a non-exclusive inclusion, such that a process, a method, an article, or a device that comprises a list of elements does not include only those elements, but may include other elements not expressly listed or inherent to such process, method, article, or device. An element defined by the phrase "includes a(n) . . . " does not, without more constraints, preclude the existence of additional identical elements in the process, method, article, or device that comprises the element.

Moreover, note that in the description, the expressions similar to "the first . . . component," "the second . . . component," or the like are only for convenience of distinguishing in description, and do not mean that they must be implemented as two or more physically separated units. In fact, the unit may be implemented as a unit integrally and also implemented as multiple units as needed. Furthermore, the terms "first" and "second" do not necessarily indicate an order, sequence, or the like. The above-mentioned series of processing includes not only the processing performed according to time series in the sequence described herein, but also the processing performed in parallel or respectively rather than according to time series.

Various embodiments have been described herein. Same or similar parts between the embodiments may be referenced to each other. Embodiments may also be combined in various manners while still maintaining their respective functions and benefits. A person skilled in the art should be able to implement or use the present disclosure. General principles defined herein may be practiced in other embodiments without departing from the spirit and scope of the present disclosure. Therefore, the present disclosure is not to be limited to the embodiments disclosed herein.

What is claimed is:

1. An apparatus comprising:
   at least two rotation shafts arranged substantially parallel to one another;
   at least two fixing members, wherein at least one fixing member is disposed at each side of the at least two rotating shafts; and
   at least two sliding members,
   wherein:
      at least one sliding member of the at least two sliding members connects at least one rotating shaft to at least one fixing member,
      a fixing member of the at least two fixing members includes an elastic member, the elastic member being engaged with at least one of the at least two sliding members to apply a compression force to the at least one sliding member upon the at least one sliding member being slid to reconfigure the apparatus from an open configuration to a closed configuration,
      each of the at least two sliding members are disposed on opposite sides of the at least two rotating shafts, and
      in response to the at least two rotation shafts rotating, a distance between the at least two rotating shafts and the at least two fixing members changes in a lengthwise direction.

2. The apparatus of claim 1, wherein a sliding member of the at least two sliding members is connected to the rotating shaft located at the outermost side of the at least two rotating shafts.

3. The apparatus of claim 2, wherein, a first end of the sliding member is fixedly connected to the rotation shaft, and a second end is slidably connected to the fixing member, wherein in response to the at least two rotation shafts rotating, the sliding member moves in relation to the fixing member.

4. The apparatus of claim 3, wherein the fixing member comprising an elastic member, wherein the elastic member comprises a first end connected to the sliding member and a second end connected to the fixing member.

5. The apparatus of claim 3, wherein the sliding member comprises a stop, and the fixing member comprises a surface, wherein the stop is configured to engage with the surface.

6. The apparatus of claim 1, further comprising a cover plate, wherein the cover plate is disposed on the at least two rotating shafts and is configured to bend with the rotating shaft set, and wherein the at least two rotating shafts are configured to be movable on a surface of the cover plate.

7. The apparatus of claim 6, wherein the cover plate is connected to the at least two fixing members.

8. The apparatus of claim 1, wherein, at least one sliding member of the at least two sliding members is disposed on a first side of the at least two rotating shafts and at least one sliding member of the at least two sliding members is disposed on a second side of the at least two rotating shafts.

9. An electronic device comprising:
   a deformable surface apparatus comprising,
   at least two rotation shafts arranged substantially parallel to one another;
   at least two fixing members, wherein at least one fixing member is disposed at each side of the at least two rotating shafts;
   at least two sliding members; and
   a flexible screen,
   wherein:
      at least one sliding member connects at least one rotating shaft to at least one fixing member,
      the at least one fixing member includes an elastic member, the elastic member being engaged with at least one of the at least two sliding members to apply a compression force to the at least one sliding member the at least one sliding member being slid to reconfigure the apparatus from an open configuration to a closed configuration,
      each of the at least two sliding members are disposed on opposite sides of the at least two rotating shafts,
      in response to the at least two rotation shafts rotating, a distance between the two or more rotating shafts and the at least two fixing members changes in a lengthwise direction, and
      the flexible screen is disposed on a surface of the at least two rotation shafts.

10. The electronic device of claim 9, wherein, a cover plate is disposed between the flexible screen and the at least two rotation shafts.

11. The electronic device of claim 9, wherein the flexible screen is disposed on a surface of the at least two fixing members.

12. The electronic device of claim 9, wherein a sliding member of the at least two sliding members is connected to the rotating shaft located at an outermost side of the at least two rotating shafts.

13. The electronic device of claim 12, wherein, a first end of the sliding member is fixedly connected to the rotation shaft, and a second end is slidably connected to the fixing member, wherein in response to the at least two rotation shafts rotating, the sliding member moves in relation to the fixing member.

14. A method comprising:
   providing at least two rotation shafts;
   providing at least two fixing members, wherein at least one fixing member is disposed at each side of the at least two rotating shafts;
   providing at least two sliding members;
   rotating the at least two rotation shafts; and
   in response to rotating the at least two rotation shafts, maintaining constant a length of the at least two rotation shafts, the at least two fixing members, and the at least two sliding members,
   wherein:
      at least one sliding member connects at least one rotating shaft to at least one fixing member,
      the at least one fixing member includes an elastic member, the elastic member being engaged with the at least one of the at least two sliding members to apply a compression force to the at least one sliding member upon the at least one sliding member being slid to reconfigure the apparatus from an open position to a closed position, and each of the at least two sliding members are disposed on opposite sides of the at least two rotating shafts.

15. The method of claim 14, wherein rotating the at least two rotation shafts comprises rotating the at least two rotation shafts into an arc shape.

16. The method of claim 15, wherein comprises rotating the at least two rotation shafts the two sliding members moving into the at least two fixing members.

17. The method of claim 16, wherein maintaining constant the length of the at least two rotation shafts, at least two fixing members, and at least two sliding members comprises moving the at least two sliding members into the at least two fixing members a length substantially equal to an increase in length of the at least two rotation shafts from a tangential straight line to a tangential arc.

18. The method of claim 14, wherein rotating the at least two rotation shafts comprises rotating the at least two rotation shafts into a substantially flat plane.

19. The method of claim 18, wherein rotating the at least two rotation shafts comprises the two sliding members moving away from the at least two fixing members.

20. The method of claim 19, wherein maintaining constant the length of the at least two rotation shafts, at least two fixing members, and at least two sliding members comprises moving the at least two sliding members away from the at least two fixing members a length substantially equal to a decrease in length of the at least two rotation shafts from a tangential arc to a tangential straight line.

* * * * *